United States Patent
Sano et al.

(10) Patent No.: US 6,231,742 B1
(45) Date of Patent: May 15, 2001

(54) ELECTROLYTIC COPPER FOIL AND PROCESS FOR PRODUCING THE SAME

(75) Inventors: Yasushi Sano; Kazuo Miyamae; Katsunori Yamada; Hisanori Manabe, all of Kyoto (JP)

(73) Assignee: Fukuda Metal Foil & Powder Co., Ltd., Kyoto (JP)

( * ) Notice: Subject to any disclaimer, the term of this patent is extended or adjusted under 35 U.S.C. 154(b) by 0 days.

(21) Appl. No.: 09/088,111

(22) Filed: Jun. 1, 1998

(30) Foreign Application Priority Data

May 30, 1997 (JP) .................................... 9-141217

(51) Int. Cl.⁷ .................................... C25D 1/04
(52) U.S. Cl. .......................... 205/50; 205/151; 205/152; 205/291; 428/606; 428/687; 428/935
(58) Field of Search ............................ 204/280; 205/50, 205/151, 152, 291, 574; 29/17.2; 428/606, 687, 935

(56) References Cited

U.S. PATENT DOCUMENTS

| | | |
|---|---|---|
| 3,923,613 | 12/1975 | Immel . |
| 4,781,801 | * 11/1988 | Frisby ................................. 204/25 |
| 5,215,646 | * 6/1993 | Wolski et al. ...................... 205/77 |
| 5,431,803 | 7/1995 | DiFranco et al. . |
| 5,454,926 | * 10/1995 | Clouser et al. ..................... 205/50 |
| 5,679,232 | * 10/1997 | Fedor et al. ........................ 205/77 |

FOREIGN PATENT DOCUMENTS

| | | |
|---|---|---|
| 141140 | 12/1984 | (GB) . |
| WO9104358A1 | 4/1991 | (WO) . |
| WO9119024A1 | 12/1991 | (WO) . |
| WO9711210A1 | 3/1997 | (WO) . |

OTHER PUBLICATIONS

WPI Accession No. 93–309523/39 & JP 5222566 A (Sumitomo) see abstract No Date Available.
WPI Accession No. 89–296965/41 & JP 1219127 A (Ishihara) see abstract No Date Available.
WPI Accession No. 89–036877/05 & JP 63310990 A (Nippon) see abstract No Date Available.
WPI Accession No. 89–036876/05 & JP 63310989 A (Nippon) see abstract No date available.
WPI Accession No. 74–49267v/27 & JP 49023137 A (Matsushita) see abstract No date Available.
WPI Accession No. 82–18374E10 & JP 57016188 A (Furukawa) see abstract No Date Available.

* cited by examiner

Primary Examiner—Kathryn Gorgos
Assistant Examiner—Christopher M Keehan
(74) Attorney, Agent, or Firm—Sughrue, Mion, Zinn, Macpeak & Seas, PLLC

(57) ABSTRACT

In a process for the production of an electrolytic copper foil from a sulfurically acidic copper sulfate electrolytic solution, the sulfurically acidic copper sulfate electrolytic solution contains additives of 0.1 to 1.0 g/l of an oxyethylenic surfactant, 50 to 250 mg/l of a chloride, 1 to 10 mg/l of a glue or gelatin and 1 to 10 mg/l of a nitrogen-containing organic compound.

14 Claims, 2 Drawing Sheets

ELECTROLYTIC COPPER FOIL AND PROCESS FOR PRODUCING THE SAME

BACKGROUND OF THE INVENTION

1. Field of the Invention

The present invention relates to an electrolytic copper foil which is used as an electrode collector for a secondary battery, an electrolytic copper foil for printed circuit and a process for the production thereof.

2. Description of the Related Art

An electrolytic copper foil is produced on an industrial basis in the following manner. That is, an insoluble electrode of titanium or lead coated with a platinum group element is used as an anode while a rotary cylindrical metallic cathode made of stainless steel or titanium is used as an opposing cathode. The space between the electrodes is filled with an electrolytic solution comprising copper sulfate and sulfuric acid. When direct current is passed across the opposing electrodes, copper is deposited on the surface of the cathode. During this procedure, the rotary cylindrical metallic cathode is rotated so that copper thus deposited is peeled off the surface of the cathode. Accordingly, it is possible to continuously produce electrolytic copper.

In general, an electrolytic copper foil which has thus separated out from an electrolytic solution comprising two components, i.e., the matte side which is deposited from copper sulfate and sulfuric acid electrolytic solution, which is referred to as roughened surface, an abnormally deposited copper the thickness of which exceeds the normal foil thickness that causes a critical defect. The electrolytic copper foil thus produced has a matte side and has pinholes therein. The electrolytic copper thus obtained exhibits a prismatic structure which grows from the shiny side towards the matte side.

For the purpose of inhibiting the abnormal deposition and occurrence of pinholes on the matte side, it is a common practice to add glue or gelatin and a chloride to an sulfurically acidic copper sulfate electrolytic solution in an amount of from 0.1 to 10 mg/l and from 0.5 to 100 mg/l, respectively. However, an electrolytic copper foil having a high hardness cannot be obtained in this additive system. The resulting matte side has pyramidal crests and thus gives a high roughness.

In recent years, the copper-clad laminate as a main purpose of electrolytic copper foil is intended to rise in the fineness of circuit pattern and reduce the gap between insulation layers. Therefore, a copper foil having an even more thickness and a low roughness at the matte side has been desired.

During the production of a copper-clad laminate, the copper foil is subjected to stress when the resin expands or shrinks under heating, thereby causing breaking of circuit or warpage or twisting of printed circuit board. It is known that such a problem can be solved by the use of a copper foil having a high elongation at high temperatures.

During the lamination of copper-clad laminates, the surface of one copper foil rubs against another to cause damage on the copper-clad laminates. In some detail, when the copper foil is heated during press molding in the procedure of production of copper-clad laminate, copper is recrystallized to lower the hardness of the copper foil. When the copper foils rub against each other during the subsequent lamination step, they have scratches on the surface thereof. In an extreme case, the copper foil is peeled off from the surface of the resin substrate.

In recent years, as cured resin for multi-layer circuit board, there has been used a resin material having a low dielectric constant, a low dielectric loss and a high heat resistance. In general, the formation of such a resin into a multi-layer circuit board requires a high forming temperature. From the standpoint of heat resistance during passage through solder flow, too, the copper foil to be incorporated in the multi-layer circuit board preferably exhibits a small hardness drop due to recrystallization while showing a sufficient elongation at high temperatures.

On the other hand, as electrode collector for secondary battery there has already been used rolled copper foil in many cases. The proportion of electrolytic copper foil occupying in the art is small.

The reasons for this fact will be described below.

(1) An ordinary electrolytic copper foil essentially differs in roughness from one surface to another. Thus, the electrolytic copper foil differs in battery properties from one surface to another. Accordingly, this difference must be considered.

(2) An electrolytic copper foil exhibits a poorer elasticity than rolled copper foil and thus can be wrinkled easily when formed into a thin foil.

(3) An electrolytic copper foil exhibits a poor flexibility.

Thus, an electrolytic copper foil cannot be used as an electrode collector for secondary battery unless these difficulties are overcome.

However, while the maximum width of a rolled copper foil is limited to about 600 mm, an electrolytic copper foil can be formed into a form having a width of not less than twice that of the rolled copper foil. Further, unlike the rolled copper foil, which is liable to pinholing when formed into a thin foil, the electrolytic copper foil is insusceptible to such a defect and thus can be formed into a thin foil to advantage on an industrial basis.

With this advantage, the use of an electrolytic copper foil as an electrode collector makes a great contribution to the drastic rise in the efficiency of the step of application of an active battery material. Further, the use of an electrolytic copper foil having a reduced thickness makes a great contribution to the reduction of the battery weight and the battery production cost and the rise in the energy density of the battery.

Thus, it goes without saying that the use of an electrolytic copper foil as an electrode collector for secondary battery requires the foregoing difficulties to be overcome. Further, taking into account the requirement that the foil be roughened on both sides thereof to exert an anchoring effect that contributes to adhesion to active battery material and exhibit a high elongation at high temperatures in response to thermal expansion during heat generation by battery and the use in a secondary battery for mobile communications apparatus or electric car, a thin foil having a mechanical strength high enough to withstand vibration is desirable.

Thus, it has been required that the electrolytic copper foil to be used for the various purposes have a reduced thickness and a low roughness on the matte side. However, the electrolytic copper foil produced by the prior art method exhibits a low hardness and thus can be easily scratched. Further, such an electrolytic copper foil exhibits a low tensile strength and thus can be easily wrinkled when formed into a thin foil, making it very difficult to handle. Moreover, such an electrolytic copper foil has a high roughness on the matte side, which greatly differs from that of the shiny side.

In general, copper which has separated out from a sulfurically acidic copper sulfate electrolytic solution containing thiourea and a chloride exhibits a high hardness and tensile strength shortly after electrodeposition. However, copper thus electrodeposited shows a poor thermal stability of these mechanical properties and thus can easily undergo primary recrystallization at room temperature to show a hardness drop.

On the other hand, as a method for the production of an electrolytic copper having a high hardness and tensile strength there may be used, e.g., a method involving the production in a very low free chloride concentration (about 1.0 to about 4.5 ppm) as described in JP-A-7-188969 (The term "JP-A" as used herein means an "unexamined published Japanese patent application"). However, this method is disadvantageous in that chlorides contained in waste wire material used as a starting material or chlorine in tap water used can inevitably contaminate the electrolytic solution system. For the purpose of inhibiting the contamination by these chlorides, approaches such as (1) purification of starting material or use of ion-exchanged water and (2) use of soluble anode can be proposed. However, the purification of a starting material causes the increase in the number of required steps. Further, the use of a soluble anode finds trouble in controlling uniformly the foil thickness crosswise and longitudinally and difficulty in supplying starting material. The use of a soluble anode inevitably causes the production of anode slime that leads to abnormal deposition. As an approach for preventing this difficulty there may be proposed the use of an anode bag. However, this countermeasure causes a current efficiency drop.

Thus, the production of an electrolytic copper foil having a high tensile strength in a low free chloride concentration has many disadvantages. The solution to these problems requires great plant and equipment investment and leads to productivity drop, resulting in the rise in product cost.

As already mentioned, the use of conventional additives makes it impossible to provide the resulting electrolytic copper foil with an excellent thermal stability while maintaining a high Vickers' hardness. On the other hand, it is difficult to control the chloride concentration within an extremely low narrow range for the purpose of producing an electrolytic copper foil having these properties. Abnormal deposition can easily occur in such a low chloride concentration. The use of such a method requires great plant and equipment investment, thereby resulting in the rise in product cost.

Therefore, it is desired to produce an electrolytic copper foil exhibiting a high hardness as well as an excellent thermal stability by widening chloride concentration range in a sulfurically acidic copper sulfate.

SUMMARY OF THE INVENTION

It is an object of the present invention to provide an electrolytic copper foil exhibiting a high hardness as well as an excellent thermal stability.

An electrolytic foil according to the present invention has a Vickers hardness in the range of 180 to 320 at 25° C. and a Vickers hardness of not less than 150 after 30 minutes of heat treatment at 220° C. In this case, it is preferable that the electrolytic foil contains chlorine in an amount of from 80 to 400 ppm.

In a process for producing an electrolytic foil according to the present invention, direct current is applied across an insoluble titanium or lead electrode coated with an element belonging to the platinum group as an anode and a rotary cylindrical metallic cathode opposed thereto with a sulfurically acidic copper sulfate electrolytic solution filling the space therebetween to cause deposition of copper on the surface of the cathode while the rotary cylindrical metallic cathode is being rotated; and copper thus deposited is peeled off from the surface of the cathode to continuously obtain electrolytic copper; wherein the sulfurically acidic copper sulfate electrolytic solution contains additives of 0.1 to 1.0 g/l of an oxyethylenic surfactant, 50 to 250 mg/l of a chloride, 1 to 10 mg/l of a glue or gelatin and 1 to 10 mg/l of a nitrogen-containing organic compound.

DETAILED DESCRIPTION OF THE INVENTION

Figure 1:
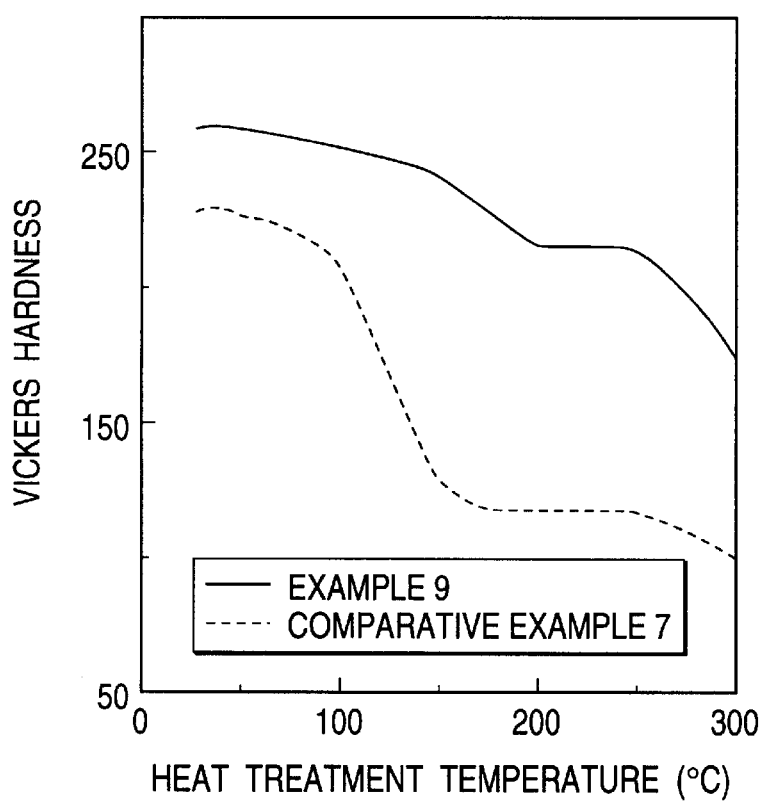
FIG. 1 illustrates the results of measurement of Vickers hardness on shiny side at room temperature of copper foil specimens which have been heated at various temperatures for 30 minutes by means of a Vickers hardness meter under a load of 5 gf of 3 seconds (thermal stability of hardness)

Detailed description of the present invention will be described in detail as follows referring to the accompanying drawings.

In the present invention, it has been found that the production of a copper foil in a conventional sulfurically acidic copper sulfate electrolytic solution containing a chloride wherein the electrolytic solution contains 0.1 to 1.0 g/l of an oxyethylenic surfactant, 50 to 250 mg/l of a chloride, 1 to 10 mg/l glue or gelatin and 1 to 10 mg/l of a nitrogen-containing organic compound makes it possible to obtain an electrolytic copper foil excellent in thermal stability of Vickers hardness.

The present invention is intended to produce an electrolytic copper foil having a high Vickers hardness and an excellent thermal stability of Vickers hardness. The electrolytic copper foil according to the present invention has a Vickers hardness in the range of 180 to 320, preferably 200 to 300, more preferably 200 to 280 at 25° C. and a Vickers hardness of 150 to 260, preferably 180 to 240, more preferably 180 to 220, after 30 minutes of heat treatment at 220° C. and a chlorine content of from 80 to 400 ppm.

If the electrolytic copper foil exhibits a Vickers hardness of not more than 180, it cannot maintain a Vickers hardness of not less than 150 after 30 minutes of heat treatment at 220° C. Consequently, it is easy to be damaged when rubbed against each other during the lamination of copper-clad laminates. On the contrary, if the electrolytic copper foil exhibits a Vickers hardness of greater than 320, it has a drastically reduced folding endurance that gives a great brittleness.

If the chlorine content in the copper foil is not more than 80 ppm, copper can easily undergo recrystallization after 30 minutes of heat treatment at 220° C. Consequently, it is impossible for the copper foil to maintain a Vickers hardness of not less than 150 and hence rendering the copper foil liable to damage. On the contrary, if the chlorine content in the copper foil is greater than 400 ppm, the copper foil exhibits a lowered electrical conductivity.

The present invention also concerns a process for the production of an electrolytic foil which includes applying direct current across an insoluble electrode of titanium or lead coated with an element belonging to the platinum group as an anode and a rotary cylindrical metallic cathode opposed thereto with a sulfurically acidic copper sulfate electrolytic solution filling the space therebetween to cause deposition of copper on the surface of the cathode while the rotary cylindrical metallic cathode is being rotated so that copper thus deposited is peeled off the surface of the cathode, whereby electrolytic copper is continuously obtained, wherein the sulfurically acidic copper sulfate electrolytic solution includes as additives an oxyethylenic surfactant, a chloride, a glue or gelatin and a nitrogen-containing organic compound incorporated therein in an amount of from 0.1 to 1.0 g/l (preferably 0.2 to 0.8 g/l, more preferably 0.3 to 0.5 g/l), from 50 to 250 mg/l (preferably 70 to 200 mg/l, more preferably 100 to 180 mg/l), from 1 to 10 mg/l (preferably 1 to 5 mg/l, more preferably 1 to 3 mg/l) and 1 to 10 mg/l (preferably 2 to 8 mg/l, more preferably 3 to 6 mg/l), respectively.

Among the foregoing additives, the oxyethylenic surfactant and chloride effect have a very important effect to provide copper thus deposited with a high hardness. The addition of the two additives determines the properties of copper thus deposited.

The use of a sulfurically acidic copper sulfate electrolytic solution merely containing an oxyethylenic surfactant and a chloride in combination can provide an electrolytic copper foil having a sufficiently low roughness on the matte side as compared with an electrolytic copper foil electrodeposited from a conventional sulfurically acidic copper sulfate electrolytic solution containing glue or gelatin. However, the uniformalization of the matte side and the reduction of roughness were accomplished by adding a nitrogen-containing organic compound for the purpose of further reducing the roughness on the matte side and raising the glossiness of the matte side.

On the other hand, the action of glue or gelatin gives a supplementary effect for the oxyethylenic surfactant. The use of glue or gelatin makes it possible to inhibit the amount of the oxyethylenic surfactant to be incorporated in the electrolytic solution.

Referring further to the present invention, examples of the oxyethylenic surfactant as used herein include polyoxyethylene-polyoxypropylene block copolymer wherein the oxypropylene moiety has an average molecular weight of from 2,000 to 4,000 and the weight proportion of oxyethylene in the total molecule is not less than 80 wt-%, polyethylene glycol (average molecular weight: 10,000 to 35,000), polyoxyethylene nonyl phenyl ether, polyoxyethylene lauryl ether, and bisphenol A-ethylene oxide adduct (average molecular weight: not less than 15,000). In the present invention, these compounds are incorporated, singly or in combination, in a sulfurically acidic copper sulfate electrolytic solution containing a chloride in an amount of from 50 to 250 mg/l to a concentration of from 0.1 to 1.0 g/l. The total oxyethylenic surfactant concentration preferably falls within the range of from 0.3 to 0.8 g/l if neither glue nor gelatin is used. If the total oxyethylenic surfactant concentration exceeds 1.0 g/l, the resulting electrolytic copper foil exhibits a reduced elongation at room temperature regardless of the presence or absence of glue or gelatin. On the contrary, if the total oxyethylenic surfactant concentration falls below 0.10 g/l, the resulting electrolytic copper foil cannot be provided with a Vickers hardness of not less than 180 and has a great roughness on the matte side.

As the chloride there may be used any compound which can easily dissociate into chlorine ions and cations in the sulfurically acidic copper sulfate electrolytic solution. Examples of the chloride employable herein include hydrochloric acid, potassium chloride, and sodium chloride. The measurement of the concentration of free chloride in the sulfurically acidic copper sulfate electrolytic solution was carried out by a method measuring the turbidity of the electrolytic solution developed by silver chloride produced by the addition of an aqueous solution of silver nitrate or by Volhard method, which is often used to measure chlorine ion concentration.

As previously mentioned, the chloride of the present invention has a very important effect. If the chloride concentration falls below 50 mg/l, the resulting copper foil has streaks on the matte side and is very brittle even if the foregoing oxyethylenic surfactant occurs in the sulfurically acidic copper sulfate electrolytic solution in an amount of from 0.1 to 1.0 g/l. On the contrary, if the chloride concentration exceeds 250 mg/l, the resulting copper foil exhibits a reduced elongation at room temperature.

The term "glue or gelatin to be used in combination with the foregoing oxyethylenic surfactant" as used herein refers to a protein obtained by the hydrolysis of an essential protein (collagen) constituting the skin or bone, which is a white connective tissue of an animal. Examples of the glue or gelatin include a low molecular water-soluble gelatin obtained by the decomposition of such a protein with a protease, followed by purification. If the glue or gelatin to be used in combination with the oxyethylenic surfactant is added in an amount of from 1 to 10 mg/l, an electrolytic copper foil having the desired high hardness can be obtained even if the oxyethylenic surfactant concentration is not less than 0.1 g/l. Thus, it is apparent that the amount of the oxyethylenic surfactant to be incorporated can be reduced as compared with the case where if neither glue nor gelatin is used, the lowest total concentration of one or more oxyethylenic surfactants at which excellent results can be obtained is 0.3 g/l.

If used in an amount of less than 1 mg/l, such a glue or gelatin cannot exert a supplementary effect for the oxyethylenic surfactant. On the contrary, if the amount of the glue or gelatin to be incorporated exceeds 10 mg/l, the resulting electrolytic copper foil exhibits a reduced elongation at elevated temperature (180° C.).

Examples of the nitrogen-containing organic compound to be added for the purpose of providing a finer matte side include α-naphthoquinoline, 1,10-phenanthroline, 4,7-diphenyl-1,10-phenanthroline, 2,9-dimethyl-1,10-phenanthroline, 4,7-diphenyl-2,9-dimethyl-1,10-phenanthroline, and heterocyclic six-membered ring compound such as pyridine, nicotic acid and triazine. Other useful examples of the nitrogen-containing organic compound include a dye or dyestuff having an unshared electron pair in its structure. An example of such a dye or dyestuff is thioflavine T or Janus Green.

The nitrogen-containing organic compound as mentioned herein is added in an amount of from 1 to 10 mg/l, preferably from 2 to 6 mg/l. If the concentration of the nitrogen-containing organic compound falls below 1 mg/l, no effect of enhancing the glossiness of the matte side of the electrolytic foil can be exerted. On the contrary, if the concentration of the nitrogen-containing organic compound exceeds 10 mg/l, the roughness of the matte side of the electrolytic foil can be lowered, but the matte side thus glossed shows fogging.

The electrolytic production of a copper foil with a soluble anode as an anode and a rotary cylindrical titanium cathode as a cathode in the sulfurically acidic copper sulfate electrolytic solution thus prepared (copper sulfate pentahydrate content: 280 g/l; sulfuric acid content: 100 g/l) at an electrolytic solution temperature of from 38° C. to 60° C. and a current density of from 20 to 50 A/dm$^2$ makes it possible to obtain an untreated electrolytic copper foil having a Vickers hardness of not less than 180 at room temperature. The untreated copper foil thus obtained was then subjected to chromate corrosion protection as a known corrosion protection to produce a copper foil for secondary battery electrode collector. Further, the untreated copper foil thus obtained was subjected to treatment disclosed in JP-B-45-34245 (The term "JP-B" as used herein means an "examined Japanese patent publication") as a roughening treatment on at least one side thereof, subjected to barrier treatment as disclosed in JP-B-2-24037, and then subjected to the foregoing corrosion protection to produce copper for secondary battery electrode collector and printed circuit board.

EXAMPLES

The present invention will be further described in the following examples.

Examples 1–17

Various additives were added to a sulfurically acidic copper sulfate electrolytic solution containing 280 g/l of copper sulfate pentahydrate and 100 g/l of sulfuric acid in an amount set forth in Table 1. Explaining the oxyethylenic surfactant (described as POE-1 or POE-2) set forth in Table 1, POE-1 is a polyethylene glycol (average molecular weight: 20,000), and POE-2 is a bisphenol A-ethylene oxide adduct (e.g., Carbowax 20M; average molecular weight: 15,000). With an insoluble anode as an anode and a rotary cylindrical titanium cathode as a cathode, copper was electrodeposited from the sulfurically acidic copper sulfate electrolytic solution thus prepared on the cathode to a predetermined thickness while the rotary cylindrical titanium cathode was being rotated. Copper thus deposited was peeled off the cathode. In this manner, an untreated copper foil was continuously produced. The untreated copper foil was then subjected to a known corrosion protection. Chromate treatment as corrosion protection may be effected in either dipping process or electrolytic process. In either case, the coverage by chromium is from 1 to 10 mg/m$^2$. Separately, the untreated copper foil thus produced was subjected to roughening on at least one side thereof and then to barrier treatment before corrosion protection to produce a copper foil for secondary battery electrode collector and printed-circuit board.

Evaluation of mechanical properties and roughness on matte side

The electrolytic copper foils obtained in Examples 1 to 17 were each measured for tensile strength (kgf/mm$^2$) and elongation (%) at room temperature and at elevated temperature (180° C.) in accordance with IPC-TM-650 by means of a tensile testing machine, folding endurance (number of folding) in accordance with JIS P8115 by means of a fold tester (radius of bent: 0.8 mm; specimen width: 15 mm), hardness on the shiny side before and after heat treatment (220° C., 30 minutes) and roughness (Ry and Rz (μm)) on the shiny side and matte side in accordance with JIS B 0651 and B 0601 by means of a surface roughness meter. The results are set forth in Table 2.

Chlorine content

For the measurement of chlorine content, gravimetric analysis was employed. The copper foil specimen was dissolved in a mixture of nitric acid and sulfuric acid. To the solution thus obtained was added an aqueous solution of silver nitrate in an excessive amount to produce precipitated silver chloride which was then measured for weight. The results of measurement of chlorine content are set forth in Table 2.

Comparative Example 1

Using a sulfurically acidic copper sulfate electrolytic solution prepared with the additives as set forth in the column of Comparative Example 1 in Table 1, an electrolytic copper foil having a thickness of 70 μm was produced in the same manner as in the preceding example. The electrolytic copper foil thus produced was then evaluated for properties in the same manner as in the preceding example. The results are set forth in Table 2.

Comparative Example 2

Using a sulfurically acidic copper sulfate electrolytic solution prepared with the additives as set forth in the column of Comparative Example 2 in Table 1, an electrolytic copper foil having a thickness of 35 μm was produced in the same manner as in the preceding example. The electrolytic copper foil thus produced was then evaluated for properties in the same manner as in the preceding example. The results are set forth in Table 2.

Comparative Example 3

Using a sulfurically acidic copper sulfate electrolytic solution prepared with the additives as set forth in the column of Comparative Example 3 in Table 1, an electrolytic copper foil having a thickness of 18 μm was produced in the same manner as in the preceding example. The electrolytic copper foil thus produced was then evaluated for properties in the same manner as in the preceding example. The results are set forth in Table 2.

Comparative Example 4

Using a sulfurically acidic copper sulfate electrolytic solution prepared with the additives as set forth in the column of Comparative Example 4 in Table 1, an electrolytic copper foil having a thickness of 18 μm was produced in the same manner as in the preceding example. The electrolytic copper foil thus produced was then evaluated for properties in the same manner as in the preceding example. The results are set forth in Table 2.

Comparative Example 5

Using a sulfurically acidic copper sulfate electrolytic solution prepared with the additives as set forth in the column of Comparative Example 5 in Table 1, an electrolytic copper foil having a thickness of 9 μm was produced in the same manner as in the preceding example. The electrolytic copper foil thus produced was then evaluated for properties in the same manner as in the preceding example. The results are set forth in Table 2.

Comparative Example 6

A rolled copper foil having a thickness of 9 μm was evaluated for properties in the same manner as in the preceding example. The results are set forth in Table 2.

Comparative Example 7

Using a sulfurically acidic copper sulfate electrolytic solution prepared with the additives as set forth in the column of Comparative Example 7 in Table 1, an electrolytic copper foil having a thickness of 35 μm was produced in the same manner as in the preceding example. The electrolytic copper foil thus produced was then evaluated for properties in the same manner as in the preceding example. The results are set forth in Table 2.

The examples of the present invention and the comparative examples will be further described hereinafter. The electrolytic copper foils produced from baths comprising a sulfurically acidic copper sulfate electrolytic solution having an oxyethylenic surfactant and a chloride set forth in the column of Examples 1 to 17 in Table 1 incorporated therein were confirmed to have a high hardness. Further, these electrolytic copper foils can maintain a high hardness even after heat treatment.

On the other hand, however, if the concentration of chloride or oxyethylenic surfactant in the sulfurically acidic copper sulfate electrolytic solution was low (Examples 16, 17), the resulting electrolytic copper foil exhibited a high hardness but showed a streak-like roughness on the matte side which was too great to evaluate mechanical properties such as tensile strength.

It was confirmed that the electrolytic copper foils of Examples 1 to 17 each contain chlorine in an amount of not less than 80 ppm while the copper foils produced from a sulfurically acidic copper sulfate electrolytic solution containing gelatin and a chloride as main additives as used in Comparative Examples 1 to 5 each contain chlorine in an amount of about 50 ppm. The copper foil shown in Comparative Example 7 was produced from a sulfurically acidic copper sulfate electrolytic solution having a very low chloride concentration and thus had a very low chlorine content.

Figure 2:
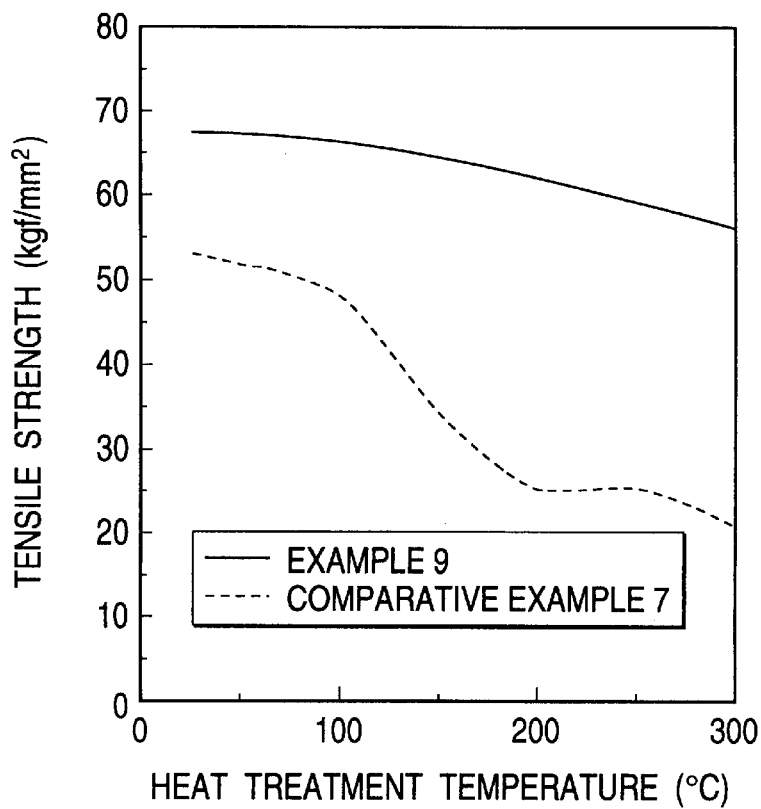
FIG. 2 illustrates the results of measurement of tensile strength at room temperature of copper foil specimens which have been heated at various temperatures for 30 minutes in accordance with IPC-TM-650 by means of a tensile testing machine (thermal stability of tensile strength)

It can be presumed that the difference in chlorine content makes a contribution to the enhancement of the thermal stability of hardness of electrolytic copper foil. An electrolytic copper foil having a relatively great chlorine content as obtained in Example 9 and an electrolytic copper foil having little or no chlorine content as obtained in Comparative Example 7 were measured for change of hardness with heat treatment temperature. The results are set forth in FIG. 1. These electrolytic copper foils were then measured for change of tensile strength with heat treatment temperature. The results are set forth in FIG. 2.

Figure 3:
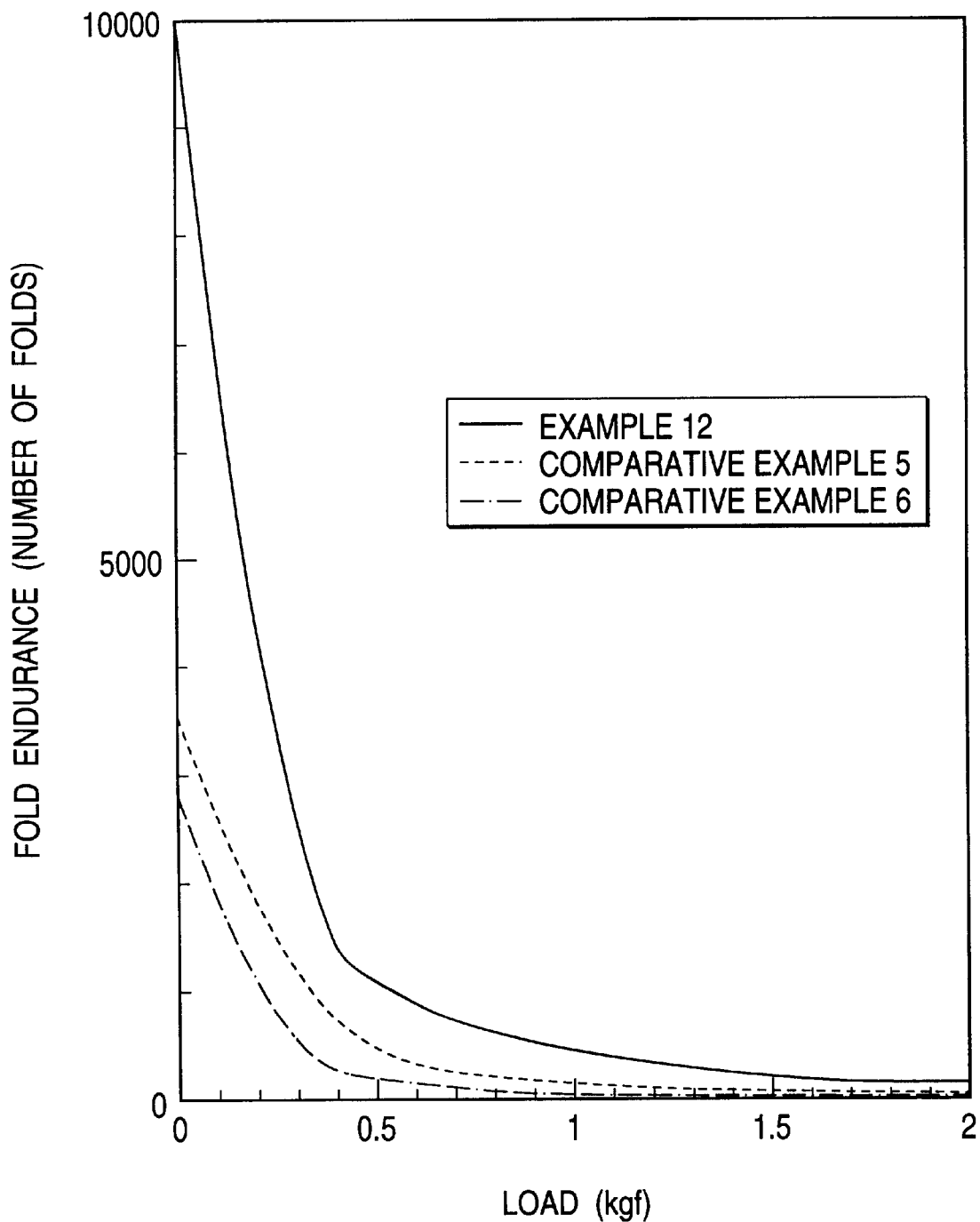
FIG. 3 illustrates the results of measurement of the dependence of fold endurance of electrolytic copper foil and rolled copper foil on load used in accordance with JIS P 8115 by means of a fold tester (radius of curvature: 0.8 mm; specimen width: 15 mm).

Another feature of the copper foil produced according to the present invention is a high fold endurance. FIG. 3 shows the dependence of fold endurance of the electrolytic copper foils of Example 12 and Comparative Examples 5 and 6 on load used. As is evident from these results, the electrolytic copper foils according to the examples of the present invention exhibit a good fold endurance over the total load range and a better fold endurance in an extremely low load range than rolled copper foils.

In Example 13, an untreated copper foil was subjected to roughening as shown in JP-B-45-34245 on the both sides thereof, and then subjected to barrier treatment as shown in JP-B-2-24037 prior to the previously mentioned corrosion protection. The copper foil thus treated was then thermally contact-bonded to a glass epoxy resin substrate. The copper foil was then etched to form a circuit having a width of 1 mm. The copper foil was then measured for peel strength on both sides thereof. As a result, the copper foil exhibited a peel strength of 105 g/mm$^2$ on the matte side and 92 g/mm$^2$ on the shiny side.

In Comparative Examples 1 to 4, electrolytic copper foils were produced from a prior art sulfurically acidic copper sulfate electrolytic solution containing gelatin and a chlorine in combination. The comparison of these electrolytic copper foils with those of the examples of the present invention having the same thickness shows that these electrolytic copper foils exhibit a low tensile strength at room temperature, a low elongation at elevated temperature (180° C.) and a great roughness on the matte side.

On the other hand, the roughness of the shiny side of an electrolytic copper foil depends on the polished condition of the surface of the rotary cylindrical metallic cathode. Therefore, no matter what additives are used, the roughness of the shiny side of an electrolytic copper foil doesn't vary. In general, an electrolytic copper foil shows a smaller roughness on the shiny side than on the matte side. Nevertheless, the electrolytic copper foils obtained in the examples of the present invention as mentioned above show almost the same roughness on the matte side as on the shiny side. However, as evident from the comparative examples, electrolytic copper foils obtained according to the conventional method shows a definite difference in roughness from matte side to shiny side.

TABLE 1

Additives and electrolytic conditions in various examples

| | | Additives | | | | Electrolytic conditions | |
|---|---|---|---|---|---|---|---|
| Example No. | POE-1[1] (g/l) | POE-2[2] (g/l) | Gelatin (mg/l) | 1,10-phenan-throline | Chloride (free) (mg/l) | Current density (A/dm$^2$) | Bath temp. (° C.) |
| Example 1 | 0.35 | 0.05 | — | — | 70 | 30 | 48 |
| 2 | 0.10 | — | 2 | — | 70 | 30 | 50 |
| 3 | 0.10 | — | 2 | — | 80 | 45 | 50 |
| 4 | 0.10 | — | 2 | — | 80 | 45 | 60 |
| 5 | 0.40 | — | — | 4 | 100 | 30 | 48 |
| 6 | 0.40 | — | — | 4 | 100 | 40 | 48 |
| 7 | 0.40 | — | — | — | 200 | 30 | 50 |
| 8–13 | 0.40 | — | — | — | 80 | 30 | 50 |
| 14 | 1.00 | — | 1 | 1 | 250 | 30 | 45 |
| 15 | 0.30 | 0.05 | 10 | 10 | 50 | 30 | 45 |
| 16 | 0.50 | — | — | — | 40 | | |
| 17 | 0.20 | — | — | — | 100 | | |
| Comparative Example 1, 2 | — | — | 1 | — | 70 | 40 | 38 |
| 3, 4, 5 | — | — | 3 | — | 50 | 40 | 38 |
| 7 | — | — | — | — | 1 | 40 | 40 |

[1]Polyethylene glycol (average molecular weight: 20,000)
[2]Bisphenol A-ethylene oxide adduct (average molecular weight: 15,000)

TABLE 2

Properties of various examples and comparative examples

| | | Physical properties at room temperature | | | Physical properties at elevated temp. (180° C.) | | Roughness on matte side | | Roughness on shiny side | | Vickers hardness (2) | | |
|---|---|---|---|---|---|---|---|---|---|---|---|---|---|
| | Foil thickness (μm) | Tensile Strength (kgf/mm²) | Elongation (%) | Fold endurance (1) (No. of folds) | Tensile Strength (kgf/mm²) | Elongation (%) | Ry (μm) | Rz (μm) | Ry (μm) | Rz (μm) | Before heat treatment | After heat treatment (3) | Chlorine content (ppm) |
| Ex. 1 | 35 | 65 | 12.0 | 120 | 18 | 11.0 | 4.0 | 3.0 | 3.2 | 2.8 | 200 | 165 | 130 |
| 2 | 35 | 65 | 10.0 | 115 | 18 | 12.0 | 5.0 | 4.0 | 3.2 | 2.8 | 205 | 170 | 140 |
| 3 | 35 | 74 | 9.0 | 105 | 19 | 15.0 | 3.8 | 2.9 | 3.2 | 2.8 | 266 | 220 | 180 |
| 4 | 35 | 72 | 10.0 | 120 | 18 | 12.0 | 3.5 | 2.8 | 3.2 | 2.8 | 249 | 205 | 185 |
| 5 | 35 | 72 | 11.0 | 125 | 19 | 15.0 | 2.5 | 1.8 | 3.2 | 2.8 | 252 | 205 | 190 |
| 6 | 35 | 77 | 9.0 | 130 | 16 | 25.0 | 2.1 | 1.7 | 3.2 | 2.8 | 295 | 250 | 210 |
| 7 | 35 | 72 | 10.0 | 130 | 18 | 11.0 | 3.0 | 2.6 | 3.2 | 2.8 | 240 | 222 | 250 |
| 8 | 70 | 70 | 14.5 | 70 | 17 | 24.0 | 3.5 | 3.2 | 3.2 | 2.8 | 235 | 210 | 160 |
| 9 | 35 | 68 | 11.5 | 120 | 18 | 11.5 | 3.2 | 2.7 | 3.2 | 2.8 | 258 | 215 | 165 |
| 10 | 18 | 68 | 8.0 | 162 | 18 | 9.0 | 3.0 | 2.5 | 3.2 | 2.8 | 222 | 204 | 160 |
| 11 | 12 | 66 | 6.5 | 195 | 18 | 7.0 | 3.1 | 2.9 | 3.2 | 2.8 | 230 | 185 | 160 |
| 12 | 9 | 64 | 5.5 | 230 | 19 | 6.0 | 3.3 | 2.7 | 3.2 | 2.8 | 220 | 178 | 165 |
| 13 | 12 | 67 | 5.5 | 155 | 19 | 6.0 | 4.0 | 3.6 | 3.7 | 3.4 | 220 | 190 | 160 |
| 14 | 35 | 80 | 6.0 | 70 | 15 | 15.5 | 3.0 | 2.3 | 3.0 | 2.5 | 320 | 260 | 400 |
| 15 | 35 | 60 | 12.0 | 140 | 17 | 22.0 | 2.8 | 2.4 | 2.4 | 2.1 | 180 | 150 | 80 |
| 16 | 35 | — | — | — | — | — | — | — | — | — | 220 | 120 | 105 |
| 17 | 35 | — | — | — | — | — | — | — | — | — | 210 | 130 | 140 |
| Comp. Ex. 1 | 70 | 35 | 11.0 | 12 | 20 | 6.0 | 8.7 | 7.9 | 3.2 | 2.8 | 103 | 95 | 55 |
| 2 | 35 | 35 | 9.0 | 102 | 20 | 6.0 | 6.3 | 5.5 | 3.2 | 2.8 | 95 | 90 | 40 |
| 3 | 18 | 38 | 6.5 | 140 | 21 | 2.0 | 5.0 | 4.6 | 3.2 | 2.8 | 121 | 105 | 60 |
| 4 | 12 | 34 | 5.5 | 108 | 15 | 2.0 | 5.0 | 4.6 | 3.2 | 2.8 | 110 | 98 | 50 |
| 5 | 9 | 41 | 5.0 | 82 | 20 | 1.0 | 4.0 | 3.6 | 3.2 | 2.8 | 118 | 110 | 50 |
| 6 | 9 | 42 | 1.2 | 22 | 13 | 7.5 | 1.0 | 1.0 | 1.2 | 1.8 | 105 | 65 | <1 |
| 7 | 35 | 54 | 7.0 | 120 | 19 | 23.0 | 3.9 | 3.4 | 3.1 | 2.7 | 225 | 120 | <1 |

(1) Fold endurance was measured under a load of 1.5 kg.

(2) Vickers hardness was measured under a load of 5 gf.

(3) The heat treatment was effected at 220° C. for 30 minutes.

In accordance with the present invention, a copper foil having a high hardness can be produced from a sulfurically acidic copper sulfate electrolytic solution having a wide chloride concentration range. Further, the presence of chlorine in the copper foil inhibits primary recrystallization of copper, accomplishing an excellent thermal stability of Vickers hardness.

What is claimed is:

1. An electrolytic copper foil, having a Vickers hardness in the range of 180 to 320 at 25° C., having a Vickers hardness of not less than 150 after 30 minutes of heat treatment at 220° C. and containing chlorine in an amount of from 80 to 400 ppm.

2. A process for producing an electrolytic foil comprising the steps of:

applying direct current across an insoluble electrode of titanium or lead coated with an element belonging to the platinum group as an anode and a rotary cylindrical metallic cathode opposed thereto with a sulfurically acidic copper sulfate electrolytic solution filling the space therebetween to cause deposition of copper on the surface of said cathode while said rotary cylindrical metallic cathode is being rotated; and peeling off copper thus deposited from the surface of said cathode to continuously obtain electrolytic copper;

wherein said sulfurically acidic copper sulfate electrolytic solution contains additives of 0.1 to 1.0 g/l of an oxyethylenic surfactant, 50 to 250 mg/l of a chloride, 1 to 10 mg/l of a glue or gelatin and 1 to 10 mg/l of a nitrogen-containing organic compound.

3. The process according to claim 2, wherein said nitrogen-containing organic compound is selected from the group consisting of α-naphthoquinoline, 1,10-phenanthroline, 4,7-diphenyl-1,10-phenanthroline, 2,9-dimethyl-1,10-phenanthroline, 4,7-diphenyl-2,9-dimethyl-1,10-phenanthroline and heterocyclic six-membered ring compound.

4. The process according to claim 3, wherein said heterocyclic six-membered ring is selected from the group consisting of pyridine, nicotic acid and triazine.

5. The process according to claim 2, wherein said nitrogen-containing organic compound is a dye or dyestuff having an unshared electron pair in its structure.

6. The process according to claim 5, wherein said dye or dyestuff is thioflavine T or Janus Green.

7. The process according to claim 2, wherein said sulfurically acidic copper sulfate electrolytic solution contains 0.2 to 0.8 g/l of oxyethylenic surfactant.

8. The process according to claim 2, wherein said sulfurically acidic copper sulfate electrolytic solution contains 0.3 to 0.5 g/l of oxyethylenic surfactant.

9. The process according to claim 2, wherein said sulfurically acidic copper sulfate electrolytic solution contains 70 to 200 mg/l of chloride.

10. The process according to claim 2, wherein said sulfurically acidic copper sulfate electrolytic solution contains 100 to 180 mg/l of chloride.

11. The process according to claim 2, wherein said sulfurically acidic copper sulfate electrolytic solution contains 1 to 5 mg/l of glue or gelatin.

12. The process according to claim 2, wherein said sulfurically acidic copper sulfate electrolytic solution contains 1 to 3 mg/l of glue or gelatin.

13. The process according to claim 2, wherein said sulfurically acidic copper sulfate electrolytic solution contains 2 to 8 mg/l of nitrogen-containing organic compound.

14. The process according to claim 2, wherein said sulfurically acidic copper sulfate electrolytic solution contains 3 to 6 mg/l of nitrogen-containing organic compound.

* * * * *